(12) United States Patent
Taylor et al.

(10) Patent No.: US 7,276,765 B2
(45) Date of Patent: Oct. 2, 2007

(54) BURIED TRANSISTORS FOR SILICON ON INSULATOR TECHNOLOGY

(75) Inventors: Theodore M. Taylor, Boise, ID (US); Won-Joo Kim, Boise, ID (US); John K. Skrovan, Granger, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/085,018

(22) Filed: Mar. 21, 2005

(65) Prior Publication Data

US 2005/0161741 A1 Jul. 28, 2005

Related U.S. Application Data

(62) Division of application No. 10/224,341, filed on Aug. 21, 2002, now Pat. No. 6,900,500.

(51) Int. Cl.
*H01L 29/72* (2006.01)
(52) U.S. Cl. ............ 257/330; 257/301; 257/332; 257/333; 257/347; 257/401
(58) Field of Classification Search .......... 257/333, 257/330, 301, 332, 347, 401
See application file for complete search history.

(56) References Cited

U.S. PATENT DOCUMENTS 5,736,435 A * 4/1998 Venkatesan et al. ........ 438/151

| | | | |
|---|---|---|---|
| 6,010,921 A | 1/2000 | Soutome | |
| 6,071,803 A | 6/2000 | Rutten et al. | |
| 6,222,210 B1 | 4/2001 | Cerny et al. | |
| 6,268,629 B1 | 7/2001 | Noguchi | |
| 6,468,847 B1 * | 10/2002 | Disney | 438/197 |
| 2001/0053569 A1 | 12/2001 | Skotnicki et al. | |
| 2002/0003260 A1 | 1/2002 | Murakami | |

OTHER PUBLICATIONS

Robert Richmond, *Silicon-On-Insulator Technology*, pp. 1-4; http://www.sysopt.com/articles/soi/index.html; accessed Apr. 10, 2002.

* cited by examiner

Primary Examiner—Edward Wojciechowicz
(74) Attorney, Agent, or Firm—Dickstein Shapiro LLP (57) ABSTRACT

A buried transistor particularly suitable for SOI technology, where the transistor is fabricated within a trench in a substrate and the resulting transistor incorporates completely isolated active areas. The resulting substrate has a decreased topography and there is no need for polysilicon (or other) plugs to connect to the transistor, unless desired. With this invention, better control is achieved in processing, particularly of gate length. The substrate having the buried transistor can be silicon oxide bonded to another substrate to form an SOI structure.

37 Claims, 12 Drawing Sheets

BURIED TRANSISTORS FOR SILICON ON INSULATOR TECHNOLOGY

This application is a divisional of U.S. patent application Ser. No. 10/224,341, filed on Aug. 21, 2002 now U.S. Pat. No. 6,900,500. The entirety of this application is hereby incorporated herein by reference.

FIELD OF THE INVENTION

The present invention concerns fabrication methods and structures for semiconductor-based integrated circuits, particularly methods for making silicon-on-insulator structures.

BACKGROUND

Integrated circuits are the key components in most modern electronic products and are interconnected micro-networks of semiconductor-based electrical components. Processing of such devices typically utilizes various techniques, such as layering, doping, masking, and etching, to build electrical components on a silicon substrate. The components are then interconnected (wired) together to define specific electric circuits, such as a computer processor or memory device. The main focus of progress for the future of integrated circuits is driven by the goals of reducing size, lowering power consumption, and increasing operating speed.

The standard technology used in the semiconductor industry for integrated circuitry has been CMOS technology. Silicon-on-insulator (SOI) differs from conventional CMOS fabrication technology by placing a transistor gate channel region over an insulator. The most common insulators used with this technique are silicon nitride and silicon oxide. With SOI technology, a gate area can have minimal capacitance; a measure of ability to store an electrical charge. Any medium that can conduct electricity has some degree of capacitance. Technically, a MOS transistor is regarded as a capacitive circuit. This implies that the MOS circuit must completely charge the capacitance to activate its switching capability. The process of discharging and recharging the transistor requires a relatively long amount of time in contrast to the time required to actually switch the voltage state of the transistor's conductive layer. SOI technology attempts to eliminate this capacitance, since a lower capacitance circuit allows faster transistor speeds.

In SOI technology, as with all other semiconductor technologies, there is always a desire to improve processing techniques to make fabrication less expensive, simpler, and faster. Another consistent desire is to increase the level of integration by making the devices smaller, denser, and more easily integrated.

SUMMARY

The invention relates to a buried transistor for SOI technology and a method of fabricating it, where the transistor is fabricated within a trench in a silicon substrate and has completely isolated active areas. The resulting substrate has a decreased topography and provides greater freedom in transistor connection. The invention also allows better control over fabrication processing, particularly as it relates to gate length.

These and other advantages of the invention will be more clearly recognized from the detailed description below, which is provided in conjunction with the accompanying drawings.

DETAILED DESCRIPTION

The invention disclosed below relates most generally SOI semiconductor transistors, which can be used in a variety of integrated circuits, including memory devices such as DRAM, SRAM, FLASH, PCRAM etc. (see, e.g., FIG. 9), or peripheral circuitry, logic circuitry, and a number of other circuits.

In the following detailed description, reference is made to various specific embodiments in which the invention may be practiced. These embodiments are described with sufficient detail to enable those skilled in the art to practice the invention, and it is to be understood that other embodiments may be employed, and that structural and electrical changes may be made without departing from the spirit or scope of the invention.

Figure 1:
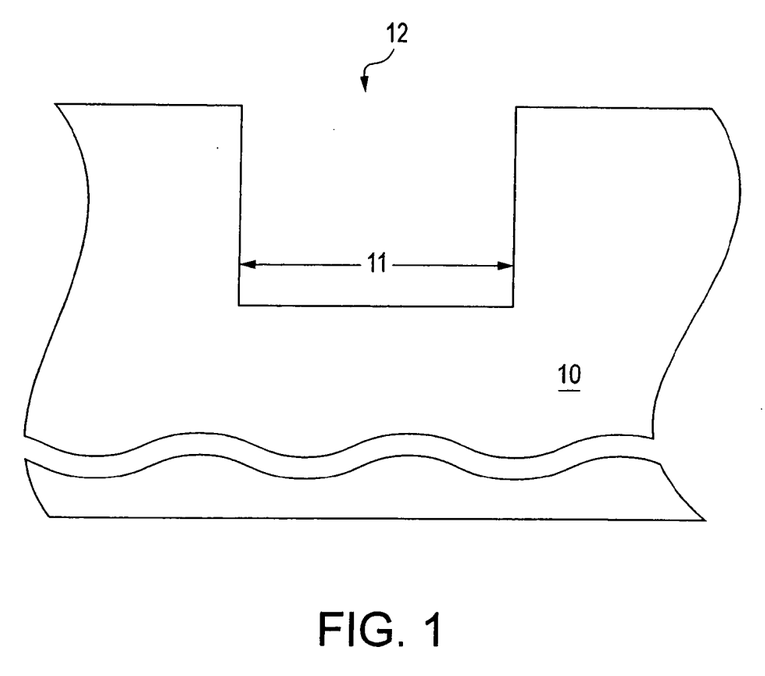
FIG. 1 shows a fabrication process in accordance with the invention at an early stage of fabrication.

Now referring to the figures, where like reference numbers designate like elements, FIG. 1 shows a preliminary stage of fabrication of a buried transistor in accordance with the invention. Throughout the following description the fabrication of a single transistor is shown for simplicity sake; however, a plurality of like transistors are typically fabricated simultaneously in the same substrate, adjacent to one another or not, as is known in the art.

As shown, in FIG. 1, a trench 12 is formed in a semiconductor substrate 10 by etching as is known in the art. Preferably, the substrate 10 is a silicon substrate; however, the invention also has applicability to other semiconductor-on-insulator structures, in which the core substrate 10 may be formed of other semiconductor materials. Etching can be performed, for example, by photolithographic masking of the substrate followed by wet etching or dry etching through openings in the masking material. The sides of the trench are preferably substantially vertical relative to the trench's depth, such that anisotropic etching is preferred. The width 11 of the trench will, in part, dictate the size of the resulting transistor.

Figure 2:
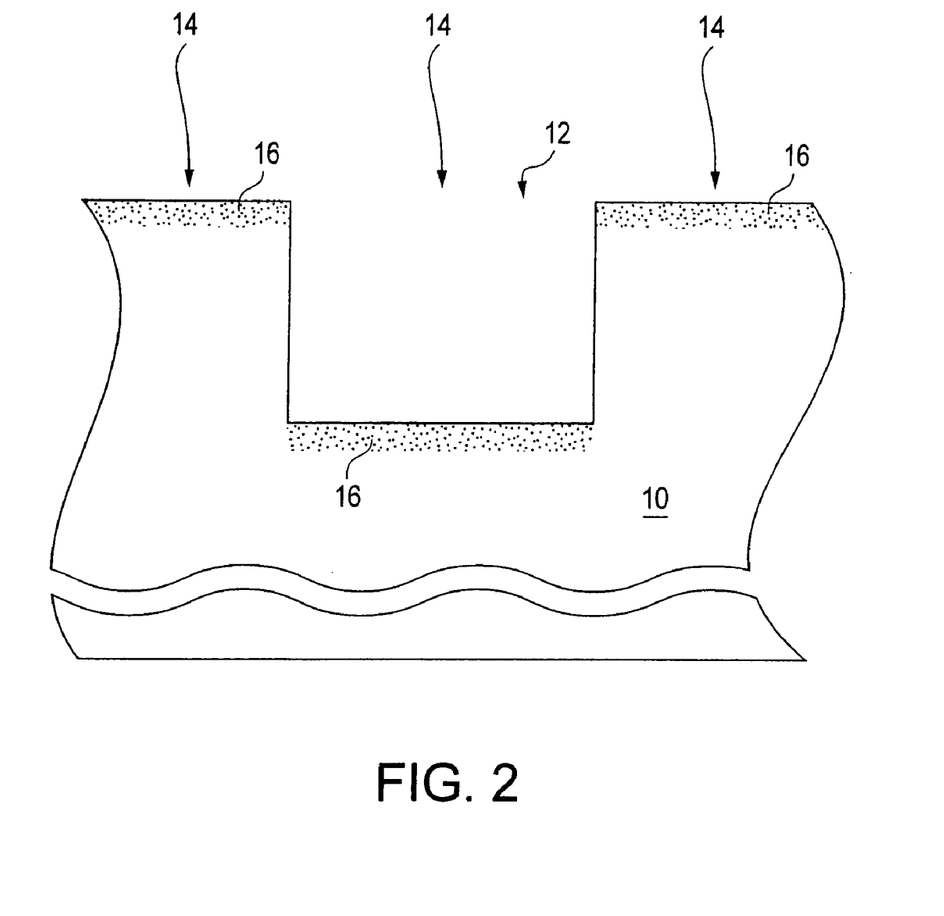
FIG. 2 shows the same fabrication process as FIG. 1 at a subsequent stage of processing.
Figure 2A:
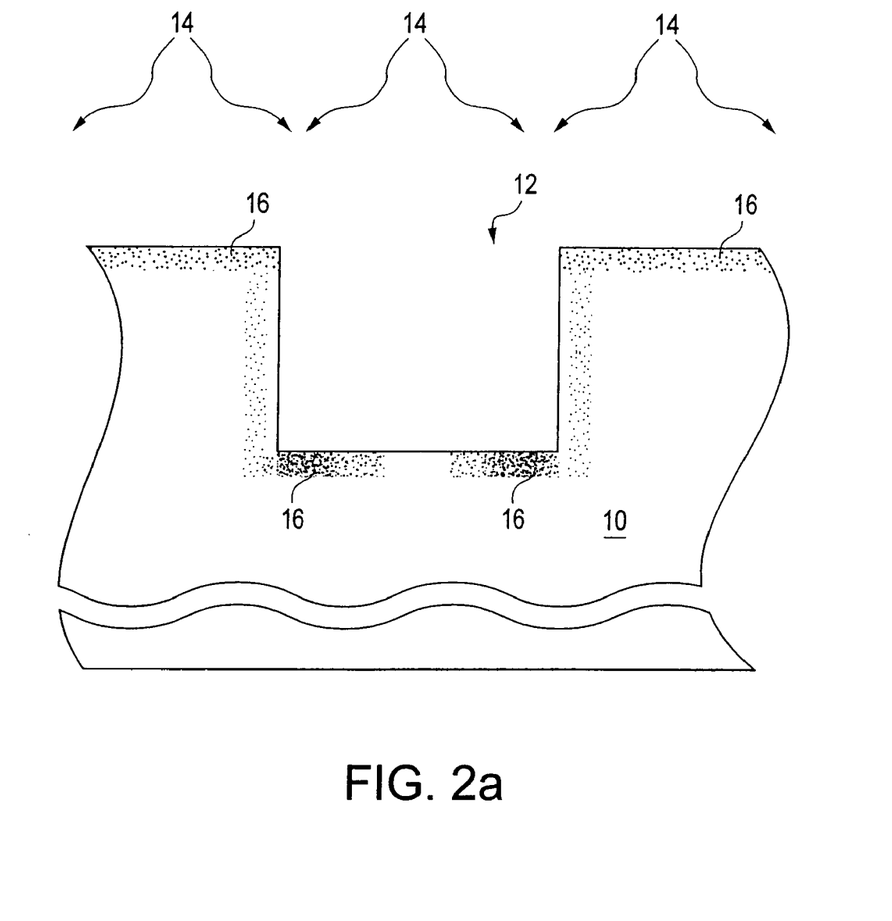
FIG. 2a shows an alternative fabrication process to that shown in FIG. 2.

After trench 12 is formed, doping is performed as shown in FIG. 2. An ion implant 14 is performed to form a doped layer at the bottom of the trench 12. As an alternative to implantation, ion diffusion can be used. This doped layer will form a lightly doped drain (LDD) region 16 of the ultimate transistor. The implant 14 for the LDD region 16 can be relatively shallow so as not to dope too much of the substrate 10. At this stage in processing, it is also possible to use an angled implant 14, as shown in FIG. 2*a*, if a halo-type implantation of dopant is desired. A halo implant may be desirable if, for example, enhancement of isolation between devices by reducing the depletion region is a goal, or if grading of junctions in order to control hot-carrier effects is needed. The trench 12 itself can act to shadow the implant if a halo implant is desired. If a halo implantation is used, the LDD region 16 will be graded with increased concentration of dopant toward the sides of the trench.

Figure 3:
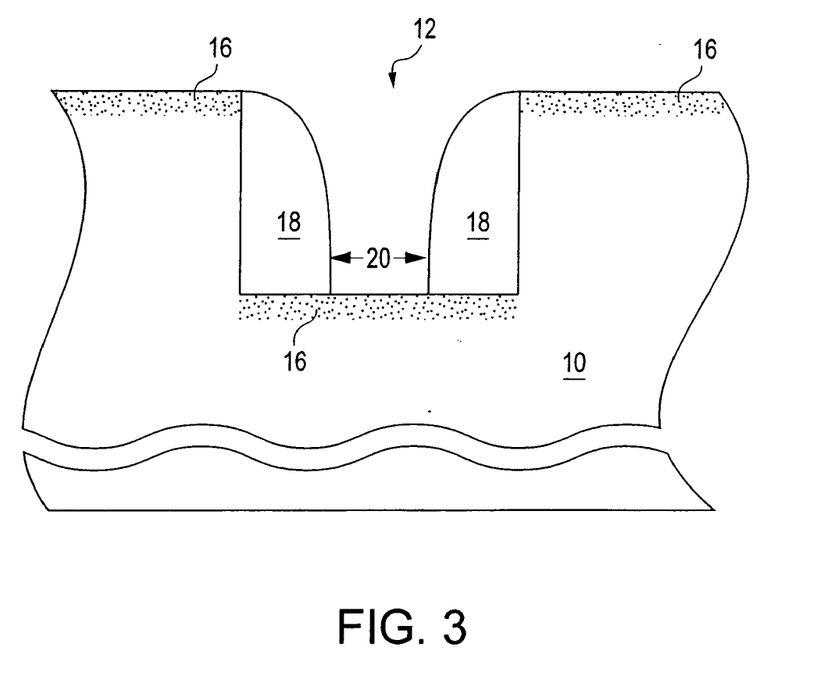
FIG. 3 shows the same fabrication process as FIG. 2 at a subsequent stage of processing.

FIG. 3 shows the next stage in processing where sidewall spacers 18 are formed on the interior of the trench 12. The spacers 18 are sidewall insulators for the transistor gate to be formed later. If the spacers 18 are nitride, a nitride layer is formed within the trench 12 and over substrate 10 and etched to remove the nitride layer from the bottom of the trench and upper surface of substrate 10 to create the spacers 18. The etching of the nitride layer can be controlled such that the space between the spacers 18 exposing the bottom of the trench 12 can be made to be a specific and desired length 20. This length 20 will ultimately be the gate length 20 of the resulting transistor. Controlling gate length 20 is highly desirable in any semiconductor transistor because changing the gate length 20 effects the transistor threshold voltage ($V_t$) needed to activate the transistor. Different transistors across the wafer can be formed with different gate lengths to set various $V_t$ across the wafer. Also, drive current is related to gate length 20 as well, wherein essentially "faster" logic devices can be fabricated by making certain transistor gates shorter.

Figure 4:
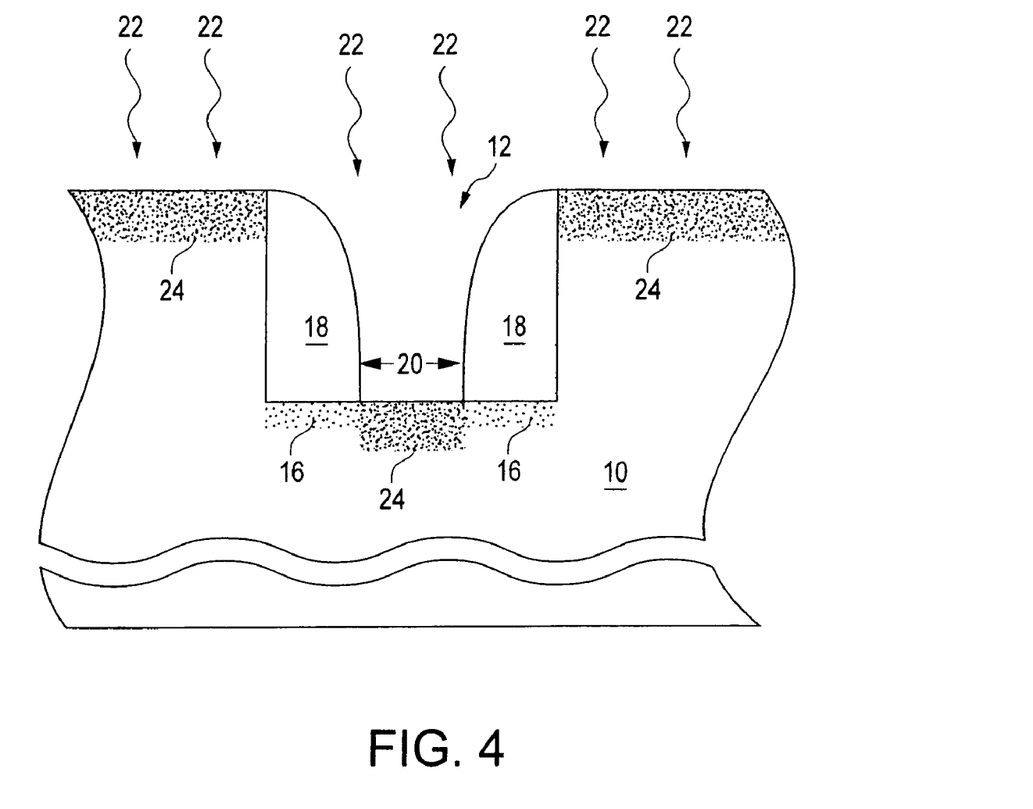
FIG. 4 shows the same fabrication process as FIG. 3 at a subsequent stage of processing.

Following the spacer 18 formation of FIG. 3, a further doping occurs to set $V_t$, as illustrated in FIG. 4. A $V_t$ implant 22 is performed to form a dopant region 24 in the substrate 10 between the nitride spacers 18. The spacers 18 shield the substrate 10 directly beneath so that what will become the transistor LDD regions 16 remain. As an alternative to ion implantation, ion diffusion can be used to form dopant region 24. As a general rule, for short channel devices, as the gate length 20 is reduced the $V_t$ is reduced as well. If it is desired that the $V_t$ be increased, for instance, to keep the same $V_t$ with a shorter gate length 20, the wafer's bulk doping can be increased, the gate oxide thickness can be increased, source/drain junction depth can be decreased, back-bias voltage can be increased, or the drain voltage can be decreased. More easily, however, the $V_t$ implant 22 can be adjusted in this stage of processing to control $V_t$.

Figure 5:
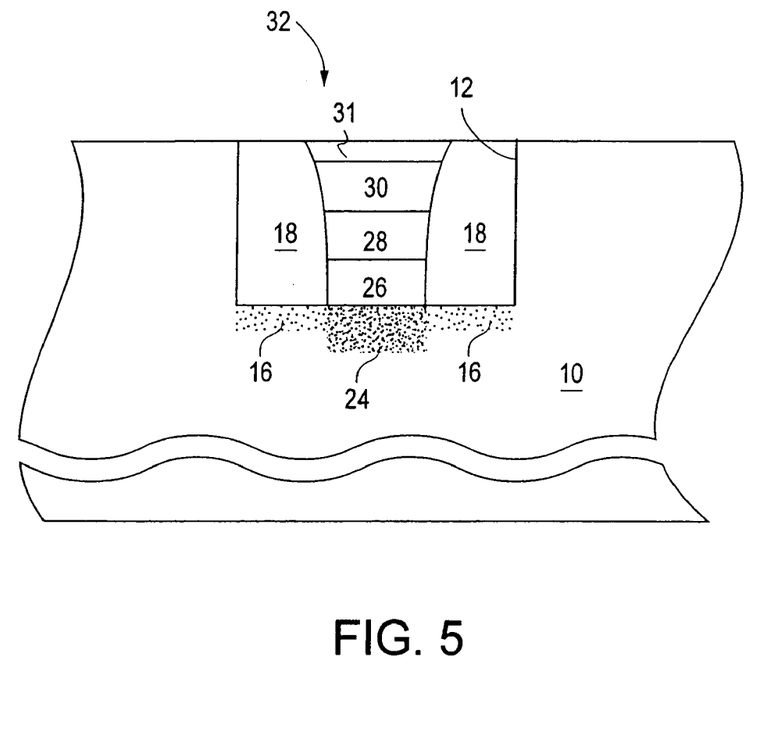
FIG. 5 shows the same fabrication process as FIG. 4 at a subsequent stage of processing.

Next, as shown in FIG. 5, the transistor gate structure is fabricated. After a preferred cleaning step, a gate oxide 26 can be grown over the substrate 10 along the bottom of the trench 12 between the spacers 16. Silicon oxide is a standard gate oxide 26 material, but others can be used as is known in the art. Next, a doped polysilicon layer 28 is formed over the gate oxide 26 and between the spacers 16. This layer 28 may be deposited by CVD, sputtering, or other techniques known in the art. A metal layer may be next deposited over the polysilicon layer 28 and heat annealed to form a silicide layer 30. Titanium and tantalum are commonly used for this purpose. A nitride cap 31 is then formed over the silicide layer, if desired; though this protective cap can be excluded if other insulating materials are later provided over the transistor structure. The above-described layers 26, 28, 30, 31 make up the gate stack 32 of the transistor. Any excess materials of these layer 26, 28, 30, 31 over the wafer (i.e., not in the trench 12) can be removed after deposition by a polishing or etching step. The wafer is polished (by, e.g., CMP) or etched to expose a surface of the substrate 10 below the surface of the dopant implants 14 and 22 on either side of the gate stack 32.

Figure 6:
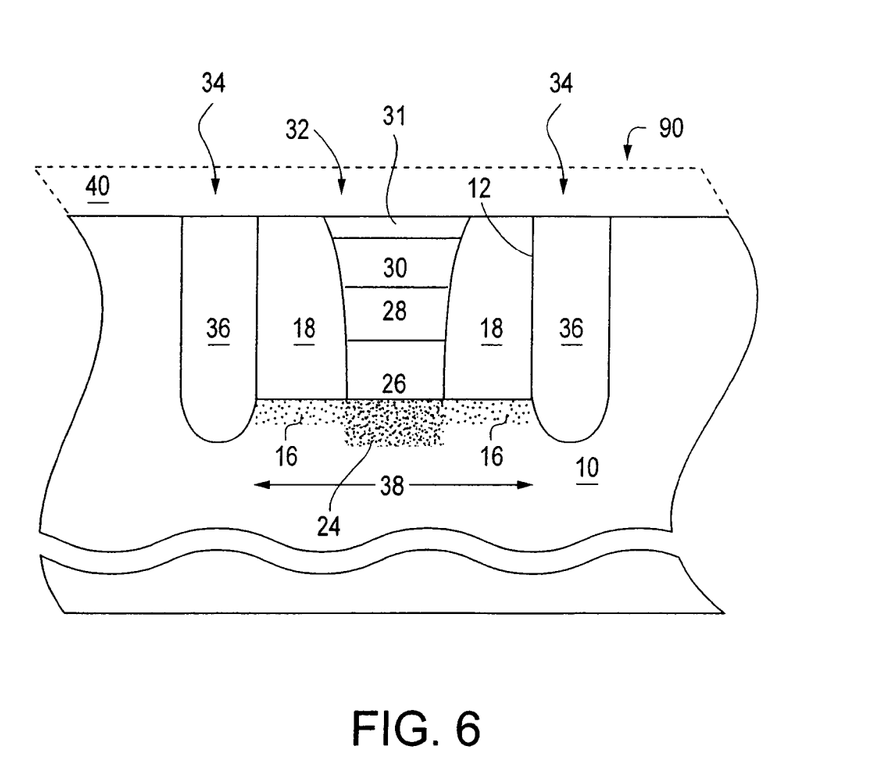
FIG. 6 shows the same fabrication process as FIG. 5 at a subsequent stage of processing.

FIG. 6 illustrates the next step in the process. A source/drain implant 34 is performed in substrate 10 to form source/drain regions 36 on either side of the gate stack 32 and spacers 18. The implant 34 can be accomplished using a mask as needed. The implant 34 should be of such a power and concentration so as to penetrate the substrate 10 to a level "below" the gate stack 32 so that a channel region 38 is formed "below" the level of the gate stack 32. An annealing step can be included to activate the implanted dopant forming the source/drain 36, if needed. After implanting (and activating) the source/drain regions 36, the transistor 90 is substantially complete. Next, an insulating layer 40 (which will become a buried insulator) can be formed over the transistor and substrate. This insulating layer 40 can be formed of silicon oxide or other insulating materials.

Figure 6A:
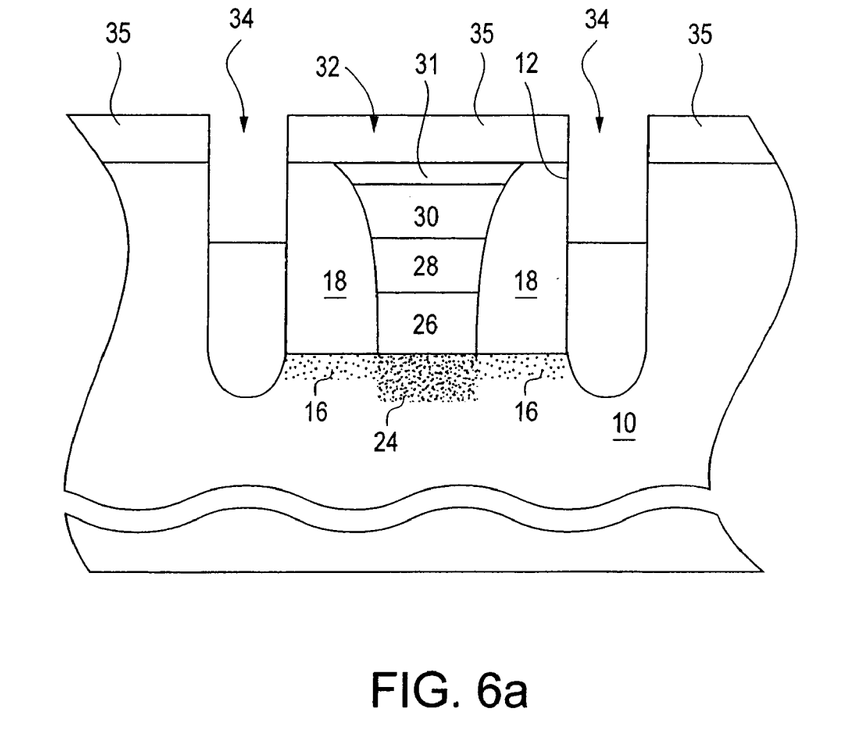
FIG. 6a shows an alternative fabrication process to that shown in FIG. 6.
Figure 6B:
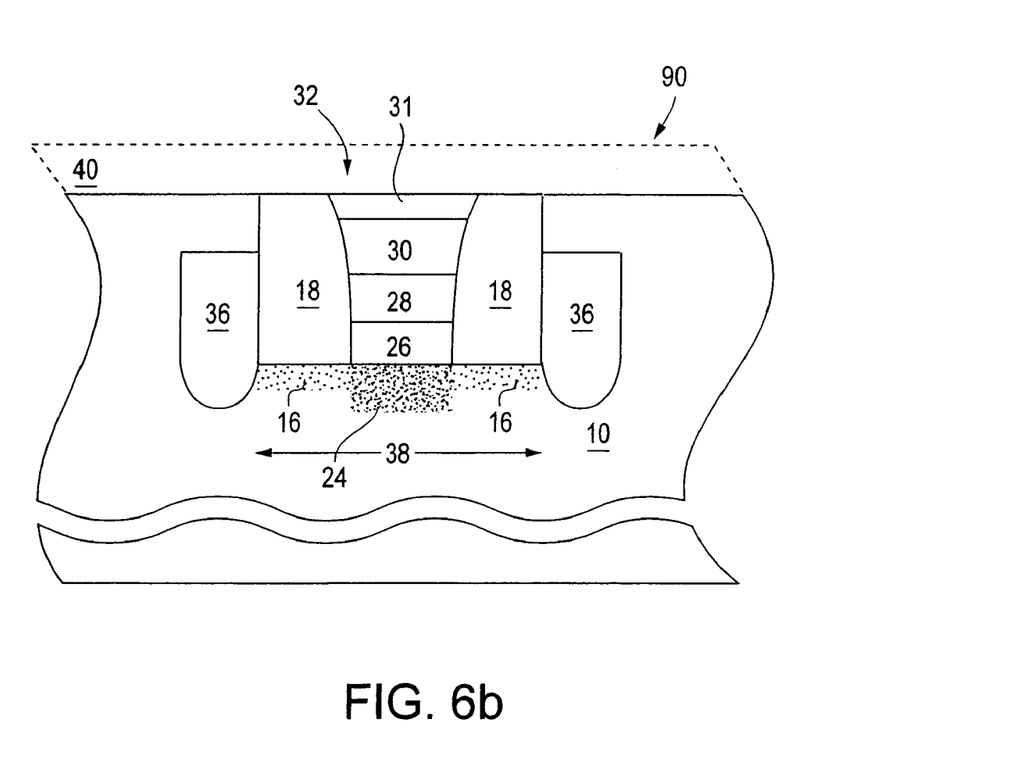
FIG. 6b shows the same fabrication process as FIG. 6a at a subsequent stage of processing.

In an alternative embodiment shown in FIG. 6*a*, the silicon of the substrate 10 adjacent to the gate stack 32 can be patterned using, e.g., a photomask 35, and etched prior to the implant 34 to be recessed below the nitride cap 31 towards the level of the gate oxide 26, if desired. The etch mask 35 would be subsequently removed after the etch and implant 34. In such an embodiment a self-aligned implant with no critical mask is necessary. Then, the substrate 10 material (e.g., silicon) can be regrown, by e.g., epitaxy, back up to be level with the "top" of the gate stack 32 as is shown in FIG. 6*b*, or the gate stack 32 can be left exposed for further processing as desired. After such regrowth, the processing continues as described above and hereafter.

Figure 7:
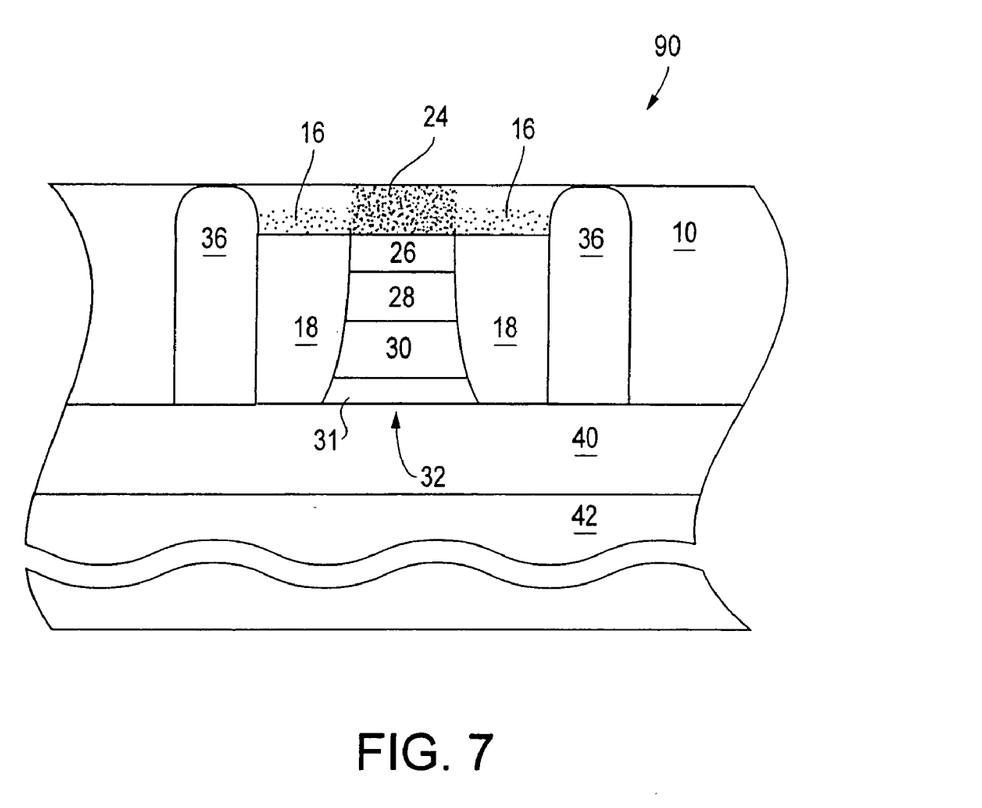
FIG. 7 shows the same fabrication process as FIG. 6 at a subsequent stage of processing.

Once a substantially complete transistor 90 and the insulating layer 40 are formed, additional processing can be performed as shown in FIG. 7. The wafer can be flipped over and a second substrate 42, preferably comprising a semiconductor material and, particularly silicon when substrate 10 is also silicon, can be bonded to the insulating layer 40, making it a buried insulating layer 40. If the insulating layer 40 is an oxide layer, the bonding of two thermally matched substrates can be accomplished by silicon oxide bonding techniques, wherein a chemical reaction occurs between the oxidized surfaces of each substrate 10 and 42. An annealing step can facilitate the silicon-oxide bond. In this way, the buried oxide insulating layer 40 truly becomes buried, as does the transistor 90. The new "top" surface of the substrate 10 can be etched or polished to a desired thickness, wherein the source/drain regions 36 can be exposed for subsequent processing.

Figure 9:
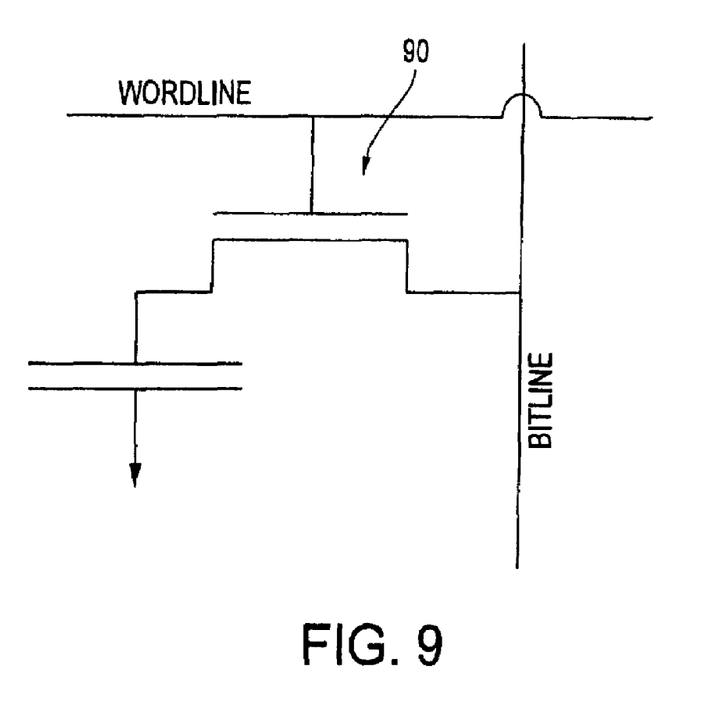
FIG. 9 shows an illustrative circuit diagram of a transistor device incorporated into a memory cell.

Subsequent processing of the wafer can include the deposition of dielectric layers and formation of other semiconductor devices in contact with the buried transistor 90. As is known in the art, capacitors can be formed in contact with the source/drain regions 26, or with plugs thereto, as can bit lines or other interconnects, if for instance, a DRAM device is to be formed. A circuit diagram for a DRAM memory cell incorporating the transistor 90 is shown in FIG. 9, where the transistor 90 acts as an access transistor between a bit line and a capacitor that provides charge coupling therebetween. Also, interconnects can be formed to the source/drain regions 26 electrically linking the transistor to, e.g., logic circuitry, or sensing devices (e.g., sense amplifiers) if the transistor is to be located in periphery circuitry. There is no limit to the uses of the buried transistor 90 in an integrated circuit and, as discussed above, the functioning of the transistor 90 can be tuned during processing so that it has a gate length 20, channel length 38, or $V_t$ as desired or necessary.

Figure 8:
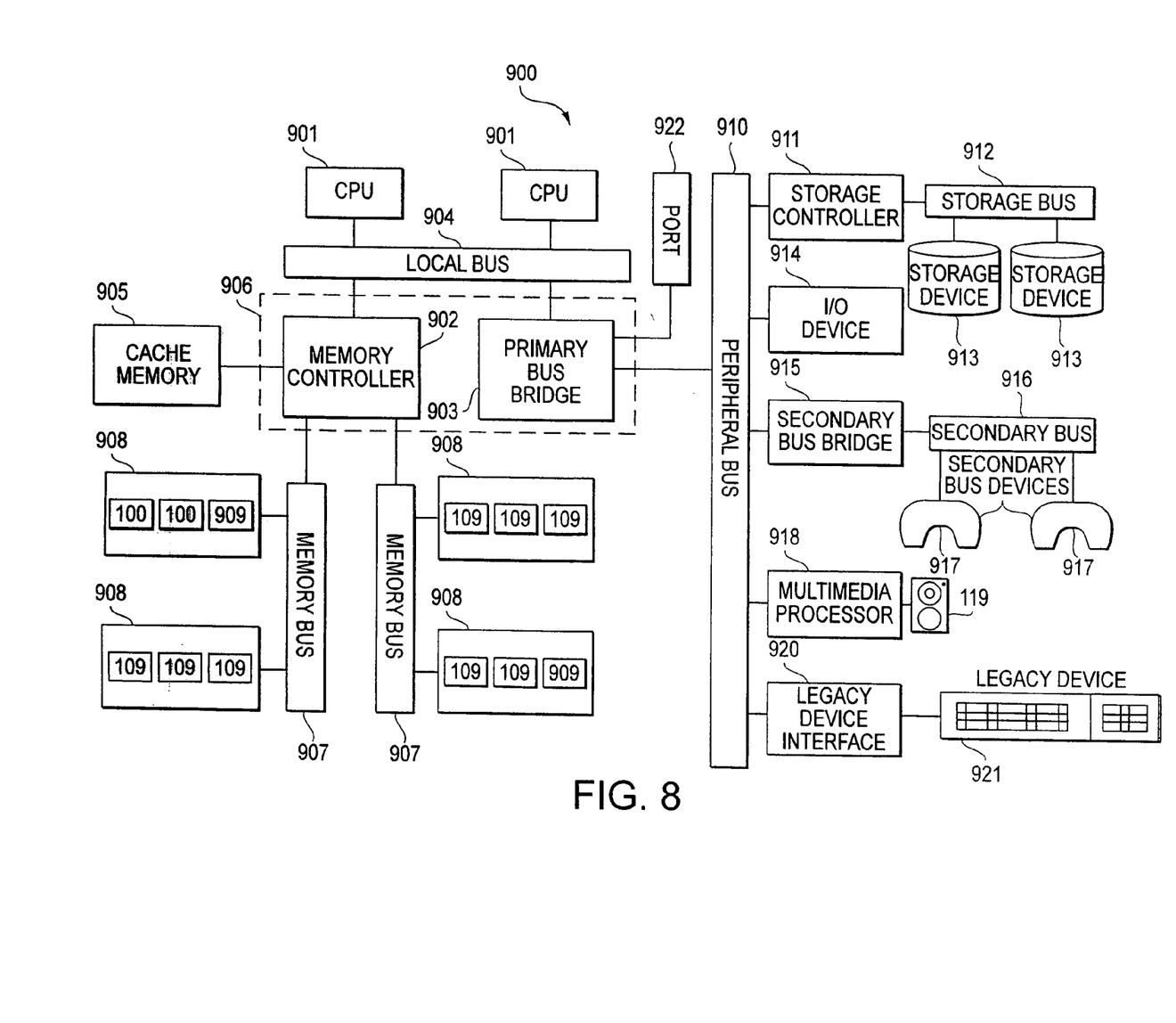
FIG. 8 shows a block diagram illustrating use of a transistor device as described herein in a processor system in accordance with the invention.

FIG. 8 illustrates an exemplary processor system 900, which can utilize the transistor device 90 of the present invention, as incorporated into a CPU 901 or memory devices 100. The processor system 900 can include one or more processors 901 coupled to a local bus 904, the processor containing transistors 90 fabricated as described above. A memory controller 902 and a primary bus bridge 903 can also be coupled the local bus 904. The processor system 900 can include multiple memory controllers 902 and/or multiple primary bus bridges 903. The memory controller 902 and the primary bus bridge 903 may be integrated as a single device 906.

The memory controller 902 can also be coupled to one or more memory buses 907. Each memory bus accepts memory components 908, which include at least one memory device 100 containing present invention. The memory components 908 may be a memory card or a memory module. Some examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 can be coupled to at least one peripheral bus 910. Various devices, such as peripherals or additional bus bridges may be coupled to the peripheral bus 910. These devices may include a storage controller 911, a miscellaneous I/O device 914, a secondary bus bridge 915, a multimedia processor 918, and a legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 can couple one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be a local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 can be used to couple legacy devices; for example, older styled keyboards and mice, to the processing system 900.

The processing system 900 illustrated in FIG. 8 is only an exemplary processing system with which the invention may be used. While FIG. 8 illustrates a processing architecture especially suitable for a general purpose computer, such as a personal computer or a workstation, it should be recognized that well known modifications can be made to configure the processing system 900 to become more suitable for use in a variety of applications. For example, many electronic devices, which require processing may be implemented using a simpler architecture, which relies on a CPU 901, coupled to memory components 908 and/or memory devices 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

The above description and accompanying drawings are only illustrative of exemplary embodiments, which can achieve the features and advantages of the present invention. It is not intended that the invention be limited to the embodiments shown and described in detail herein. The invention can be modified to incorporate any number of variations, alterations, substitutions or equivalent arrangements not heretofore described, but which are commensurate with the spirit and scope of the invention. The invention is only limited by the scope of the following claims.

What is claimed is:

1. A semiconductor structure, comprising:
    a first semiconductor substrate;
    a transistor formed in a trench within said first semiconductor substrate, said transistor comprising a gate stack structure including a gate electrode, first and second spacers on the sides of said gate electrode, source and drain regions adjacent to said first and second spacers, and a channel region between said source and drain regions,
    wherein said gate stack structure is completely buried within said trench and is provided below a first surface of said semiconductor substrate;
    a buried insulator layer provided in contact with said first surface of said semiconductor substrate; and
    a second semiconductor substrate having a first surface in contact with said buried insulator layer.

2. The semiconductor structure of claim 1, wherein said second semiconductor substrate is bonded to said buried insulator layer.

3. The semiconductor structure of claim 2, wherein said second semiconductor substrate is bonded to said buried insulator layer by a silicon-oxide bond.

4. The semiconductor structure of claim 1, comprising a lightly doped drain region in said first semiconductor substrate and adjacent to each of said first and second spacers.

5. The semiconductor structure of claim 1, wherein said buried insulator layer is an oxide.

6. The semiconductor structure of claim 1, wherein said source and drain regions extend from a second surface of said first semiconductor substrate to said first surface of said first semiconductor substrate.

7. The semiconductor structure of claim 1, wherein said first semiconductor substrate and said second semiconductor substrate comprise the same material.

8. The semiconductor structure of claim 7, where said same material is silicon.

9. The semiconductor structure of claim 1, wherein said transistor is part of a memory cell of an integrated circuit.

10. A silicon-on-insulator transistor structure, comprising:
a first silicon substrate having a trench;
a buried gate in said trench and completely formed below a first surface of said first silicon substrate, said gate having a pair of insulating sidewalls defining a channel region and a gate length;
source and drain regions formed in said first silicon substrate on either side of said channel region and adjacent to said insulating sidewalls; and
an oxide layer supported by said first silicon substrate, adjacent to said buried gate and on an opposite side of said first silicon substrate from a side containing said channel region.

11. The silicon-on-insulator transistor structure of claim 10, comprising a second silicon substrate bonded to an opposite side of said oxide layer from said first silicon substrate, wherein said oxide layer is a buried oxide layer.

12. The silicon-on-insulator transistor structure of claim 11, wherein said second silicon substrate is bonded to said buried oxide layer by a silicon-oxide bond.

13. The silicon-on-insulator transistor structure of claim 10, comprising a lightly doped drain region in said first silicon substrate and adjacent to each of said insulating sidewalls.

14. The silicon-on-insulator transistor structure of claim 10, wherein said buried gate is within an inverted trench in said first silicon substrate.

15. The silicon-on-insulator transistor structure of claim 10, wherein said source and drain regions extend from a first surface of said first silicon substrate to a second surface of said first silicon substrate that is in contact with said buried oxide layer.

16. The silicon-on-insulator transistor structure of claim 10, wherein said transistor is part of a memory cell of an integrated circuit.

17. A memory device, comprising:
an access transistor structure for a memory storage device, said access transistor structure comprising:
a first silicon substrate supporting said access transistor;
a second silicon substrate bonded to said first silicon substrate;
a gate stack structure comprising a gate electrode within a buried trench formed in a first surface of said first silicon substrate and over said second silicon substrate, said gate stack structure having insulating spacers on sides thereof and formed completely below said first surface of said first silicon substrate; and
source and drain regions within said first silicon substrate and adjacent to said insulating spacers.

18. The memory device of claim 17, comprising a buried oxide layer separating said first and second silicon substrates.

19. The memory device of claim 18, wherein said second silicon substrate is bonded to said buried oxide layer by a silicon-oxide bond.

20. The memory device of claim 17, comprising a lightly doped drain region in said first silicon substrate and adjacent to each of said insulating spacers.

21. The memory device of claim 17, wherein said buried trench in said first silicon substrate extends to a buried oxide layer.

22. The memory device of claim 18, wherein said source and drain regions extend from a first surface of said first silicon substrate to a second surface of said first silicon substrate that is in contact with said buried oxide layer.

23. A semiconductor device, comprising:
a first silicon substrate bonded at a first surface to a second silicon substrate through a buried oxide layer; and
a transistor being formed within said first silicon substrate and completely below said first surface of said first silicon substrate said transistor having a gate stack structure comprising a gate electrode contained by a pair of spacers, a channel region on an opposite side of said transistor from said buried oxide layer, and source and drain regions adjacent to said spacers on opposite sides of said channel region.

24. The semiconductor device of claim 23, wherein said second silicon substrate is bonded to said buried oxide layer by a silicon-oxide bond.

25. The semiconductor device of claim 23, comprising a lightly doped drain region in said first silicon substrate and adjacent to each of said spacers.

26. The semiconductor device of claim 23, wherein said gate stack structure is within a buried trench in said first silicon substrate.

27. The semiconductor device of claim 23, wherein said source and drain regions extend from said first surface of said first silicon substrate to a second surface of said first silicon substrate that is in contact with said buried oxide layer.

28. The semiconductor device of claim 23, wherein said transistor is part of a memory cell of an integrated circuit.

29. A processor system, comprising:
a processor; and
a memory circuit coupled to said processor, at least one of said memory circuit and processor comprising:
a first semiconductor substrate;
a transistor, formed in a trench within a first surface of said first semiconductor substrate, having a gate stack structure comprising a gate electrode, first and second spacers on the sides of said gate electrode, source and drain regions adjacent to said first and second spacers, and a channel region between said source and drain regions,
wherein said gate stack structure is completely buried within said trench and is provided below said first surface of said semiconductor substrate;
a buried oxide layer provided in contact with said first surface of said semiconductor substrate; and
a second semiconductor substrate having a first surface in contact with said buried oxide layer.

30. The processor system of claim 29, wherein said second semiconductor substrate is bonded to said buried oxide layer.

31. The processor system of claim 30, wherein said second semiconductor substrate is bonded to said buried oxide layer by a silicon-oxide bond.

32. The processor system of claim 29, comprising a lightly doped drain region in said first semiconductor substrate and adjacent to each of said first and second spacers.

33. The processor system of claim 29, wherein said gate stack structure is between said spacers within said trench, said buried trench extending to said buried oxide layer.

34. The processor system of claim 29, wherein said source and drain regions extend from a second surface of said first semiconductor substrate to said first surface of said first semiconductor substrate that is in contact with said buried oxide layer.

35. The processor system of claim 29, wherein said first and second semiconductor substrates comprise the same material.

36. The processor system of claim 35, where said same material is silicon.

37. The semiconductor structure of claim 29, wherein said transistor is part of a memory cell of an integrated circuit.

* * * * *